United States Patent [19]

Braslau et al.

[11] 4,366,493
[45] Dec. 28, 1982

[54] SEMICONDUCTOR BALLISTIC TRANSPORT DEVICE

[75] Inventors: Norman Braslau, Katonah; John L. Freeouf, Cortlandt; George D. Pettit, Mahopac; Hans S. Rupprecht, Yorktown Heights; Jerry M. Woodall, Bedford Hills, all of N.Y.

[73] Assignee: International Business Machines Corporation, Armonk, N.Y.

[21] Appl. No.: 161,611

[22] Filed: Jun. 20, 1980

[51] Int. Cl.³ .............................................. H01L 27/12
[52] U.S. Cl. .......................................... 357/4; 357/15; 357/65; 357/22
[58] Field of Search .......................... 357/4, 22, 15, 65

[56] References Cited

U.S. PATENT DOCUMENTS

| | | | |
|---|---|---|---|
| 3,381,188 | 4/1968 | Zuleeg et al. | 357/22 X |
| 3,889,284 | 6/1975 | Schiel | 357/16 X |
| 4,110,488 | 8/1980 | Risko | 357/15 OR |
| 4,183,033 | 1/1980 | Rees | 357/22 OR |
| 4,263,605 | 4/1981 | Christou et al. | 357/22 X |

OTHER PUBLICATIONS

*Electronics Letters*, vol. 16, No. 4 (1980).
T. F. Deutsch, D. J. Ehrlich, and R. M. Osgood, Jr., "Laser Photodeposition of Metal Films with Microscopic Features", *Applied Physics Letters*, 35, No. 2 (1979) pp. 175–177.
J. A. Sze, *Physics of Semiconductor Devices*, pp. 749–778.
M. S. Shur and L. F. Eastman, "Ballistic Transport in Semiconductor at Low Temperatures for Low-Power High-Speed Logic", *IEEE Transactions on Electron Devices*, vol. ED-26, No. 11, (1979) pp. 1677–1683.
H. Shichijo, K. Hess and G. E. Stillman, "Orientation Dependence of Ballistic Electron Transport and Impact Ionization".
H. Rees, G. S. Sanghera, and R. A. Warriner, "Low-Temperature F.E. T. for Low-Power High-Speed Logic", *Electronics Letters*, vol. 13, No. 6 (1977) pp. 156–158.
H. Masuda, M. Nakai and M. Kubo, "Characteristics and Limitation of Scaled-Down MOSFET's Due to Two-Dimensional Field Effect", *IEEE Transactions on Electron Devices*, vol. ED-26, No. 6, (1979) pp. 980–986.
R. H. Dennard, F. H. Gaensslen, H. N. Yu, V. L. Rideout, E. Bassous and A. R. LeBlanc, "Design of Ion-Implanted MOSFET's With Very Small Physical Dimensions", *IEEE Journal of Solid State Circuits*, vol. SC9, No. 5, (1974) pp. 256–268.
V. L. Rideout, "A Review of the Theory and Technology for Ohmic Contacts to Group III–V Compound Semiconductors", *Solid State Electronics*, vol. 18 (1975) pp. 541–550.
W. T. Anderson, Jr., A. Christou and J. E. Davey, "Development of Ohmic Contacts for GaAs Devices Using Epitaxial Ge Films", *IEEE Journal of Solid-State Circuits*, vol. SC-13, No. 4, (1978) pp. 430–435.

*Primary Examiner*—Martin H. Edlow
*Assistant Examiner*—J. Carroll
*Attorney, Agent, or Firm*—Alvin J. Riddles

[57] ABSTRACT

A semiconductor device of the ballistic type, wherein the carrier transport in the body of the device from one electrode to the other takes place essentially free of collisions, is fabricated with a semiconductor body having a long mean-free path, a body width between ohmic electrodes that is less than or equal to the product of the velocity of a carrier and the time to a collision, but more than the distance that will permit quantum mechanical tunnelling, an impressed voltage less than required for an intervalley carrier transition and having the ohmic external contact on each surface of the body free of any barrier to carrier flow. A ballistic type triode device is provided with a current modulating electrode included within the body of the device. The triode device body is of n type conductivity gallium arsenide containing a zinc doped p type conductivity gallium arsenide current modulating inclusion in the body and having, as at least one ohmic external contact, a graded bandgap indium gallium arsenide region.

14 Claims, 14 Drawing Figures

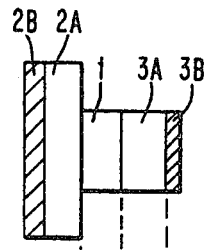
FIG. 5
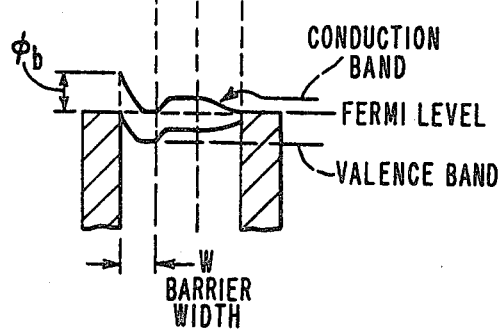
FIG. 6
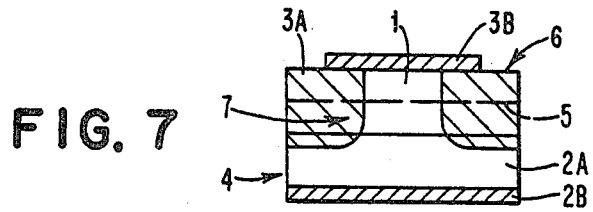
FIG. 7
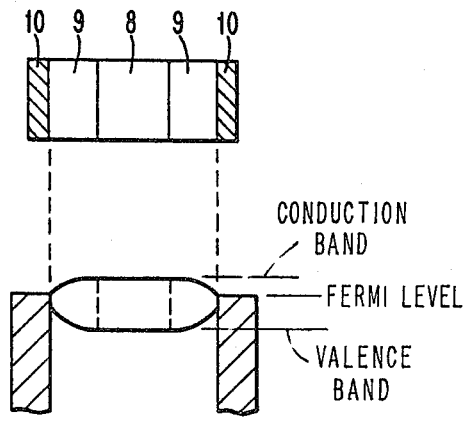
FIG. 8
FIG. 9

SEMICONDUCTOR BALLISTIC TRANSPORT DEVICE

DESCRIPTION

1. Technical Field

The technical field of the invention is that of high speed semiconductor devices. In semiconductor devices there have been limitations on the response in that the carriers, on which current flow depends, encounter collisions in the device body. A class of devices have been recently developed wherein the transport of the carriers from one electrode to another is arranged to occur essentially without such collisions so that the carrier velocity in the device is a direct function of the applied voltage and is at a theoretical maximum. These devices have come to be known in the art as "ballistic" transport devices.

2. Background Art

There have been a number of efforts in the field to develop a ballistic transport device. In one example, reported in *The IEEE Transactions on Electron Devices*, Vol. ED-26, No. 11, November 1979, a long mean-free path semiconductor material such as gallium arsenide is employed as a current carrying channel in a field effect transistor. Such a device has a short propagation delay and low power consumption.

Another type of ballistic transport structure involves the use of semiconductor carrier injection and collection across a metal base. Such structures are set forth in U.S. Pat. No. 4,286,275 and in copending application Ser. No. 118,171 filed Feb. 4, 1980.

There is a class of devices that do not involve "ballistic transport" but that are structurally similar. These devices are known as GUNN effect devices wherein conduction is dependent on a phenomenon known as intervalley carrier transitions. These devices are discussed in the text of *Physics of Semiconductor Devices*, by Sze on pages 749 to 778 and are characterized by the fact that the length of the device body is such that collisions take place.

DESCRIPTION OF DRAWING

FIG. 5 is one structural configuration embodying the invention.

FIG. 6 is an energy level diagram correlated with FIG. 5.

FIG. 7 is another structural configuration embodying the invention.

FIG. 8 is an illustration of still another structural configuration of the invention.

FIG. 9 is an energy level diagram correlated with FIG. 8.

DISCLOSURE OF INVENTION

The invention involves majority carrier ballistic transport in a semiconductor device. In such a device carriers traverse a crystal semiconductor body region between two ohmic electrodes essentially without a collision.

The phenomenon of "ballistic transport" is a mechanism in which carriers travel like an electron beam and will yield the theoretical maximum speed in a device but there are a number of stringent criteria in the device structure and operating conditions that must be met.

The conditions in the semiconductor body in the distance over which the "ballistic transport" is to take place must be such that significant energy and momentum reducing collisions do not take place.

The distance in the semiconductor body between the ohmic electrodes is greater than will permit quantum mechanical tunnelling and of the order of the mean-free path of the semiconductor material chosen for the body. The longer the mean-free path of the material of the semiconductor body, the more relaxed will be the ohmic electrode spacing.

Since collisions can occur with doped impurities, the doping level in the body, which also affects the mean-free path length, must be below the region where the probability of collisions is increased, yet there should be enough impurities to provide a practical current in a device. Collisions can also occur with the crystal lattice. One type of lattice collision involves an intervalley carrier transition where the effect is a transfer of the carrier from a low mass to a high mass condition. The impressed voltage across the semiconductor body should be less than would produce an intervalley carrier transition.

The available operating voltage is the energy gap between the conduction band and the nearest minimum energy valley and for a semiconductor material such as gallium arsenide is of the order of 0.3 electron volts.

Since the available operating voltage is so small the ohmic external electrodes must be such that essentially no barrier to current flow is present between each electrode and the semiconductor body. While a large area contact will reduce current density and lower resistance and is not difficult to achieve for the side of the device involving the substrate, a small area, totally ohmic contact must be provided for the opposite side. This is achieved by providing an ohmic electrode involving an atomically compatible graded bandgap semiconductor material which operates to remove all barriers between the metal contact and the semiconductor body.

Carrier flow modulation in the structure of the invention is provided by a control electrode in the semiconductor body which under the influence of proper biasing will affect the cross-sectional area of current flow in the body of the device.

BEST MODE FOR CARRYING OUT THE INVENTION

Figure 1:
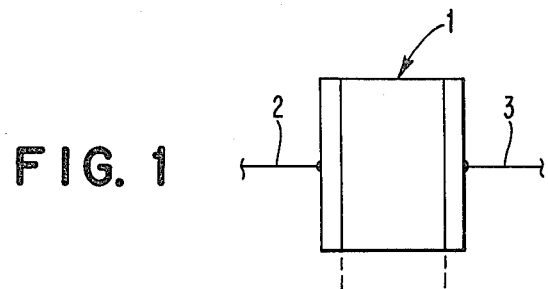
FIG. 1 is a schematic illustration of a two terminal embodiment of the ballistic transport device of the invention.
Figure 2:
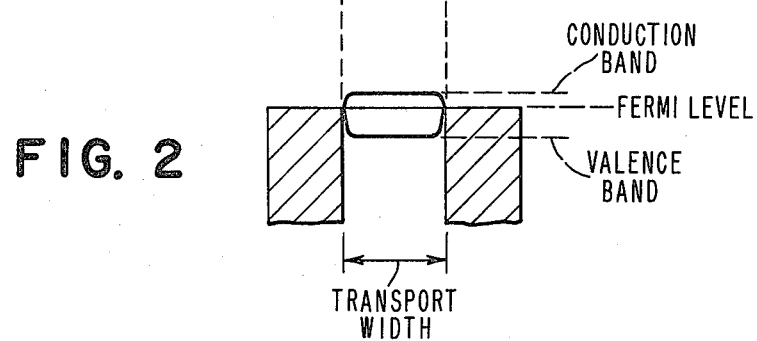
FIG. 2 is an energy level diagram of the device correlated with FIG. 1.

Referring to FIG. 1 an illustration is provided of the ballistic transport device of the invention in a two-terminal configuration. In FIG. 1 a body 1 is made of a semiconductor. The body 1 will have a transport width illustrated in FIG. 2 in the vicinity of the mean-free carrier path length for the material of the body 1 so that a carrier can traverse the body 1 without a collision. The device is provided with external electrodes 2 and 3 having total ohmic barrier free contacts. Referring to FIG. 2 wherein a correlated energy level diagram is provided, it will be seen that between the metal electrodes 2 and 3 in the body 1 the conduction band rises just above the Fermi level at the interface with the external contacts. Under these conditions since the transport width of the body 1 is within the mean-free path length of a majority carrier in the particular semiconductor material, the carriers introduced by either of the contacts 2 or 3 will traverse ballistically, in other words, with essentially no collision, from electrode 2 to electrode 3. In such a structure the current will be the product of the number of carriers and the velocity. There will be upper and lower limits in a ballistic device to the doping density, the transport width and the impressed voltage.

With respect to the doping density since the conduction mechanism is to be free of collisions the number of impurities cannot exceed the order where the probability of collisions is increased yet the doping density must be large enough to support an adequate current density. There is a relationship between impurities and mean-free path. The maximum of the mean-free path length occurs when the body 1 is of such purity that lattice scattering dominates the carrier transport mechanism. The addition of impurities act to decrease the mean-free path. For the material, gallium arsenide the doping density should be of the order of less than $10^{16}$ atoms/cm$^3$ to prevent scattering and greater than $10^{14}$ atoms/cm$^3$ to support current.

With respect to the transport width the desirable distance is of the order of the mean-free path of the material of the body. The manufacturing techniques at this state of the art are near the limit at the mean-free path length. When the transport width exceeds the mean-free path length the probability of collisions increases rapidly.

A lower limit on the barrier width of the body 1 is such that quantum mechanical tunnelling takes place. This dimension is very small compared to the mean-free path length and for the material, gallium arsenide is of the order of less 100 angstroms compared to a mean-free path length of less than 0.5 microns or preferably about 2000 to 4000 angstroms. The "transport width" dimension of FIg. 2 is usually described in the technical literature as the mean-free path length of the carrier and the symbol (-l-) is used.

With respect to the impressed voltage, the device operates between the value needed for conduction but less than that required for an intervalley carrier transition above which collisions with the lattice take place. For the material gallium arsenide, the impressed voltage is less than 0.3 volts.

The modes of operation are such that two operating ranges are involved. In the first range carriers are merely crossing the body 1 whereas in the second range the carriers are injected and are accelerated across. In the first range, the low voltage range the carrier density is constant and varies in accordance with equation 1.

$$I \propto \sqrt{V} \qquad \text{Equation 1:}$$

In the second range, carrier density and velocity are voltage dependent and vary in accordance with equation 2.

$$I \propto V^{3/2} \qquad \text{Equation 2}$$

Impressed voltages of the order of Equation 2 may produce sufficient collisions that the effect will be masked.

A device having the body 1 made of gallium arsenide will have a desirable mean-free path length in excess of 2000 Å long for ease of manufacture yet it will be longer than will permit quantum mechanical tunnelling. The doping level should be greater than $10^{14}$ atoms/cm$^3$ for good conductivity but less than $10^{16}$ atoms/cm$^3$ to prevent impurity collisions and the impressed voltage should be of the order of 0.3 volts which will provide a field across the transport width insufficient to produce an intervalley transition of the carriers resulting from a collision with the crystal lattice of the body.

The ballistic transport device of the invention can be more clearly understood when contrasted with the Gunn type device which depends on collisions to produce the dipole on which performance is based. In the Gunn type device where the body material is gallium arsenide the impressed voltage must be greater than 0.3 volts so as to produce carrier intervalley transitions which transfer the carriers from a low mass condition to a high mass condition.

In the ballistic type device of the invention in contrast, the carriers are always in the low mass condition.

Further, in the Gunn type device the length of the body must accommodate the dipole domain and is sensitive to the doping density. The doping density for the material, gallium arsenide, for the Gunn type device is usually less than $10^{14}$ atoms/cm$^3$ and the length to accommodate the dipole is many times longer than mean-free path length of around 0.5 microns of the ballistic type device and is of the order of 100–200 microns.

With the small signal required, it is essential that there be no resistance elsewhere in the circuit that could overcome the effect. It is necessary to provide as ohmic contacts 2 and 3, electrodes that have essentially no barrier to carrier flow.

Figure 3:
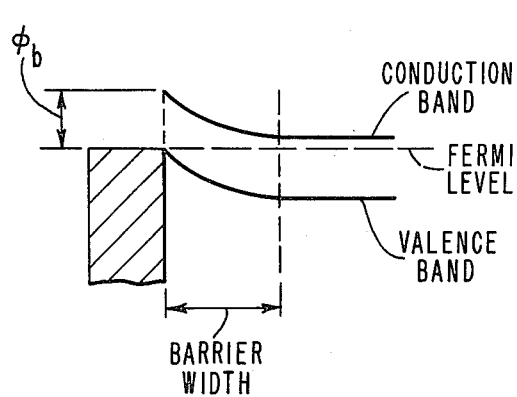
FIG. 3 is an energy level diagram indicating the characteristic barrier at the surface between a metal and many types of semiconductors.

Referring next to FIG. 3 an energy level diagram is provided to illustrate a inherent barrier to carrier flow that is present at a metal semiconductor interface. Such barriers appear at most metal semiconductor interfaces but they are particularly significant in the intermetallic type of semiconductors such as GaAs that are desirable because of the long mean-free path which makes fabrication easier.

Figure 4:
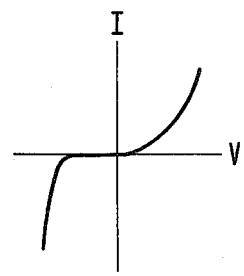
FIG. 4 is a voltage-current graph of the barrier of FIG. 3.

In FIG. 3 the surface carrier trap states of the semiconductor operate to produce band bending and a barrier labelled $\phi_b$ between the Fermi level and the conduction band is present at the surface. This surface state condition is referred to in the art as Fermi level pinning. The band bending reaches a distance into the body of the device before the conduction band is at its proper level. The distance is labelled "barrier width" in FIG. 3. The energy required to overcome the barrier translates in an operating device into a non-linear contact resistance. This is illustrated in FIG. 4 where the result of a barrier $\phi_b$ is seen in the graph of voltage-current as a rectifying type operating characteristic. Where the resistance effect of the non-linearity of the operating characteristic of a contact dissipates a significant portion of the available signal in a ballistic transport type of device, the effect can reduce or defeat the operation of the device, since the available signal is in a narrow range just great enough to produce transport but less than that required for carrier intervalley transitions.

In accordance with the invention the absence of contact barriers as indicated by the energy level diagram of FIG. 2 may be achieved by providing, for at least one of the ohmic contacts a graded energy gap type ohmic contact wherein a region of graded energy gap is graded from the large value at the body to a smaller value not exceeding 0.5 electron volts at the metal contact and yet atomic compatability so as to prevent any barrier at the interface with the body is maintained at the interface with the semiconductor body. Such a contact is described in copending patent application Ser. No. 158,664 filed June 12, 1980. With such an ohmic contact, resistance is then reduced to the point where the rectifying type characteristic of FIG. 4 disappears.

Another approach to the reduction of contact resistance may be achieved by providing a large area for the contact. Where the device is made on a substrate, this approach is readily achieved by forming the body 1 of the device on a larger portion of the substrate. With such a structure a smaller graded band gap ohmic contact can then be made to the side of the body 1 away from the substrate.

Referring next to FIG. 5, in accordance with the invention the body 1 is illustrated with two types of ohmic contacts. In FIG. 5 the transport body 1 is formed on a broad area highly doped contact made up respectively, of a highly doped semiconductor region 2A and a metal covering 2B. On the other side of the body 1 an ohmic contact having a graded semiconductor region 3A with atomic compatability with the body 1 and with a band gap of less than 0.5 electron volts at the surface with a metal 3B. In this type of structure, the current density is lower in the larger area region of contact 2A and 2B and any barrier at the surface with the metal 2A is kept sufficiently narrow by doping to produce quantum mechanical tunnelling so that an ohmic performance characteristic is achieved.

Referring to FIG. 6, an energy level diagram is provided to further illustrate some aspects of the performance of the device of FIG. 5. In FIG. 6 in the portion associated with the regions 2A and 2B, while the barrier $\phi_b$ of FIG. 3 is still present, the heavy doping in the region 2A operates to reduce the barrier width to a dimension compatible with quantum mechanical tunnelling so that the carriers tunnel through the thin barrier. This, combined with the reduction of current density that occurs because of the larger cross-sectional area of 2A and 2B compared to that of the body 1 produce an ohmic performance. Ohmic electrode 3, however, achieves ohmic performance differently. It is made up of regions 3A and 3B. The region 3A involves an intermediate atomically compatible semiconductor region having a graded bandgap which, without introducing any barrier at the interface with the body 1, operates to bring the energy gap at the other interface with the metal 3B to within 0.5 electron volts. Under these conditions any barrier at the interface with the metal 3B essentially disappears.

It is essential that the series contact resistance not dominate the device resistance. In principle the ratio of "contact" resistance to "bulk" resistance should be independent of cross-sectional area as described in equation 3.

$$2 \, \rho c/\rho l \lesssim 0.1 \qquad \text{Equation 3}$$

where $\rho c$ is "contact" resistivity and $\rho$ is "bulk" resistivity which in turn is $$\frac{1}{\frac{\Delta \text{ current density}}{\Delta \text{ voltage}}} \cdot l$$

and l is the length or transport width in FIG. 2.

A specific value for the example material gallium arsenide may be established from equation 4.

$$\rho c \lesssim \frac{0.1 \, \rho l}{2} \sim \frac{(0.1)(10^{-5})}{2} < 10^{-6} \text{ ohm cm}^2 \qquad \text{Equation 4:}$$

It will be apparent that high quality ohmic contacts are required.

Conduction in the structure of FIG. 5 takes place ballistically across the transport body 1, that is, carriers introduced at the interface with region 2A cross the body 1 essentially without collision since the criteria previously discussed that the width of the body 1 be in the vicinity of the mean-free path length of a carrier, the doping level be high enough for adequate current but less than that which would produce a high probability of collisions and the impressed voltage is less than that which would produce an intervalley carrier collision.

Referring next to FIG. 7, the structure of FIG. 5 may be fabricated by removing or neutralizing some material. A substrate 4 is provided with an external metal electrode 2B and a highly doped region 2A. The substrate 4 is masked and a body region 1 is grown epitaxially thereon for a distance less but in the vicinity of the mean-free path length of a majority carrier in the particular material selected for the body 1. At a line of demarcation 5, the growth of the semiconductor continues with another semiconductor 3A such that atomic compatability sufficient to avoid an interface barrier is maintained and the energy gap which is progressively lowered to 0.5 electron volts at the interface 6 with the metal external contact 3B. The reduced cross-sectional areas for the body 1, may be achieved by masking the substrate 4 before growth, and then converting the material labelled 7 by etching or by a damaging ion implant well known in the art.

The cross-sectional area of the body 1 is determined by the current carrying capacity desired. Using for an example, material of gallium arsenide, a current density of $10^4$ amperes/cm$^2$ at 0.1 volt, for a current of 10 milliamperes through the device between contacts 2B and 3B, a cross-sectional area for region 1 would be $10^{-6}$ cm$^2$.

As an example to provide a starting place for one skilled in the art to practice the invention the structure of FIG. 7 may be fabricated by growing on a substrate 2A of n+ gallium arsenide (GaAs) doped with Se, Si or Ge to a concentration of $10^{19}$ atoms/cm$^3$ a body 1 region of nearly intrinsic GaAs is grown by reducing the Se, Si or Ge concentration to about $10^{16}$ atoms/cm$^3$. The transport width dimension of the body 1 is about 2000 to 4000 angstroms. The growth may be by the techniques of chemical vapor deposition (CVD) or by molecular beam epitaxy (MBE) known in the art. When the desired transport width dimension is established, indium is introduced into the GaAs growing conditions to grow a region of $Ga_{1-x}In_xAs$ with a steadily increasing value of x to pure InAs over an additional distance of a 2000 angstroms.

The region 7 is then subjected to a damaging ion implant using one of the following implant species:
boron at mass 11, or
oxygen at mass 16 or
a proton such as hydrogen at mass 1 or
a deuteron at mass 2,
through a mask that provides a device area in the region of the contact 3 of 1 square mil. Metal contacts of Au, Ag or In are applied as electrodes 2B and 3B.

Referring next to FIG. 8, an illustration is provided wherein contacts 2 and 3 in connection with FIG. 1 are both a graded bandgap type of ohmic contact. In this structure the transport body 8 of, for example, gallium arsenide, is provided with a graded energy gap region on each side thereof of, for example, $Ga_{1-x}In_xAs$ graded to InAs at the metal external electrode interface. Each of these regions is labelled 9 and metal external electrode contacts 10 are made to each.

Referring next to FIG. 9 an energy level diagram for the device of FIG. 8 is shown wherein at the interface with the metal contacts 10 there is an initial region of InAs having a bandgap in the vicinity of 0.35 electron volts and the barrier height of less than zero at the interface with the metal. Throughout the regions 9, the quantity of Ga increases and the quantity of In is progressively reduced through region 9 until it is pure gallium arsenide at the interface with body 8. The device of FIG. 8 may be fabricated in a manner similar to that described in connection with FIG. 7 with the addition that the substrate 4 will be InAs graded through $Ga_{1-x}In_xAs$ to GaAs at the interface with the body 1.

The ballistic transport device of the invention may be provided with a capability for modulating the current flow through the body 1 region so as to produce triode type operation.

Figure 10:
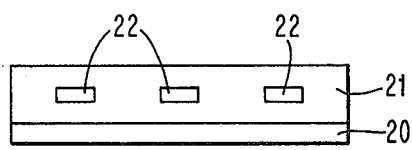
FIGS. 10, 11 and 12 are illustrations of structures in the process steps for the fabrication of a three terminal structural configuration of the invention.

Referring to FIG. 10, the technique of molecular beam epitaxy (MBE) coupled with the technique of localized photochemical decomposition such as through the use of a laser are employed to provide a conductive control grid during the crystalline growth of the transport width of the body 1.

In FIG. 10 a region 20 for example, doped greater than $10^{19}$ atoms/cm$^3$ is employed as a substrate for the MBE growth of a ballistic transport body of GaAs labelled 21. Localllized regions 22 of opposite conductivity type are introduced during the growth of the region 21 by photochemical decomposition of an organometallic compound containing an appropriate dopant. A portion of region 21 of 1000 to 2000 Å of, for example, GaAs n type conductivity doped to about $10^{16}$ atoms/cm$^3$ with Si is first grown. Holographic interference patterns are generated using two lasers of different but appropriate energies so that an organometallic compound such as $Zn(CH_3)_2$ is caused to decompose in a grid pattern doping the portion of the n type region 21 in the pattern 22 with zinc, a p type dopant.

This technique is well known in the art and is described in *Applied Physics Letters*, 35(2), July 15, 1979 for localized Cd doping of InP during chemical vapor deposition growth.

As the growth progresses, a selected grid type pattern 22 of inclusions is produced. A return to uniform conditions will permit the remaining 1000-2000 angstrom portion of the growth of the region 21 to take place as n type and upon completion there will be included a grid or grating of inclusions 22 of opposite or p type conductivity.

Figure 11:
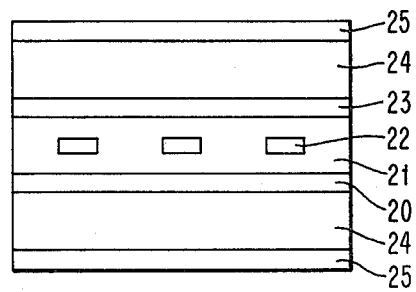

Referring next to FIG. 11 the growth is continued beyond the region 21 so that a region 23 of GaAs corresponding to the GaAs region 20 is grown. The growth conditions and the sample conditions are then changed to provide for the controlled addition of In and reduction of Ga. A graded region of $Ga_{1-x}In_xAs$ 24 is grown on each side, that is, on regions 20 and 23 from GaAs graded to a region 25 which is InAs.

Figure 12:
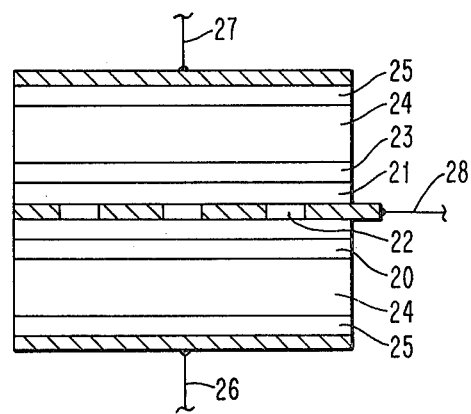

Referring next to FIG. 12, metal electrodes 26, 27 and 28 are then applied. The electrodes labelled 26 and 27 correspond respectively, to electrodes 2 and 3, in FIG. 1, and to 2B and 3B in FIGS. 5 and 7. A stripe 28 is then applied, insulated from region 21, and electrically linking all of the p type or opposite conductivity type inclusions 22.

The structure of FIG. 12 is then a gated or control grid type ballistic transport structure wherein carrier transport across the ballistic transport width which is region 21 can be modulated by electrically reducing the effective cross-sectional area of the region 21 by bias on the grating 22 which is in a plane parallel to the ohmic contacts, thereby permitting triode type operation. The criteria set forth in connection with the two-terminal structure must also be met with the structure of FIG. 12. The transport width of region 21 must be of an order greater than will permit quantum mechanical tunnelling and of the order of the mean-free carrier path length of the material of the region 21. The doping density in the region 21 must be sufficient to support reasonable current yet be less than would have a high probability of collisions. The impressed voltage across the region 21 should be less than that which would produce intervalley carrier transitions.

Figure 13:
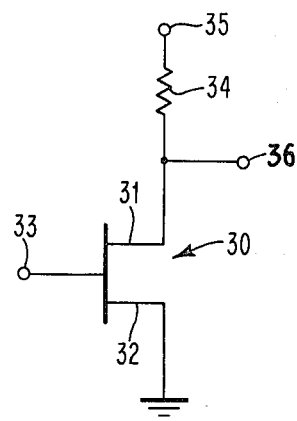
FIG. 13 is a circuit employing the three terminal structural configuration of the invention.

Referring next to FIG. 13 an illustrative circuit is provided for the device of FIG. 12. In FIG. 13 a triode device 30 is made up of an anode 31, a cathode 32 and a control or input 33. The cathode 32 is shown connected to ground and the anode 31 is connected through a load resistor 34 to a driving voltage at terminal 35. An output 36 is connected to the anode 31. In such a circuit signal variations on the input 33 which corresponds to the electrode 28 connected to the grid 22 of FIg. 12 operates to change the impedance through the device 30 between the cathode 32 and the anode 31 by pinching off carrier flow across the region 21 of FIG. 12.

Figure 14:
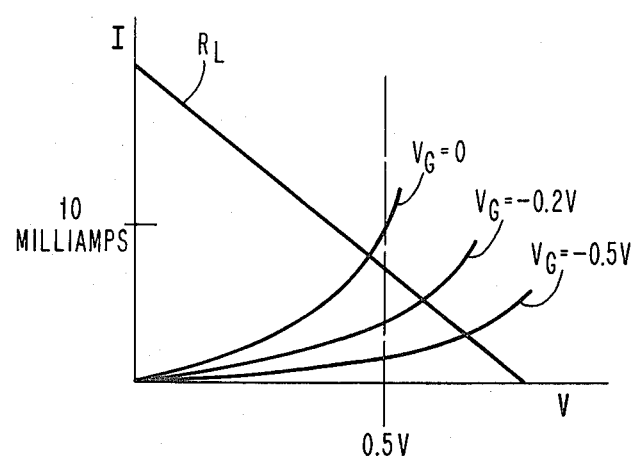
FIG. 14 is a voltage current graph illustrating performance of the circuit of FIG. 14.

Referring next to FIG. 14 wherein the operating performance for a load labelled $R_L$ corresponding to the resistor 34 of FIG. 13 is shown. The resistor 34 may be an epitaxial resistor formed in series with the device of FIG. 12 in integrated fashion. The various operating characteristics are shown, for example, voltages for the material gallium arsenide. Where specific voltage shifts are desired such as for logic operations a level shifting diode of about 0.8 volts may be added in series with resistor 34.

What has been described is a structural semiconductor configuration that permits ballistic type carrier transport. The structure has true ohmic external electrode performance so that the carriers in the resulting structure can traverse the region without collision at a maximum theoretical speed of around $10^{-14}$ seconds.

Having described the invention, what is claimed as new and what is desired to secure by letters patent is:

1. Semiconductor signal translating apparatus comprising in combination:

a semiconductor body having at least first and second essentially parallel electrode faces, said body having;
- a distance between said faces being more than a distance permitting quantum mechanical tunnelling and less than the mean-free carrier path length of the material of said body;
- a doping density less than that which provides a high probability of carrier collisions but sufficient for practical device current flow;
- a barrier free ohmic contact having a resistance of less than $10^{-6}$ ohm $cm^2$ to each of said first and second electrode faces, and
- means providing an impressed voltage across said body of a magnitude sufficient for current flow but less than the magnitude sufficient to produce an intervalley carrier transition.

2. The apparatus of claim 1 wherein at least one said ohmic contact involves an atomically compatible region between said electrode face and an external electrode that reduces in energy band gap from that of said body at the interface with said body to less than 0.5 electron volts at the interface with said external electrode.

3. The apparatus of claim 2 wherein the second ohmic contact has a larger area than the contact involving said atomically compatible region.

4. The apparatus of claim 1 wherein said semiconductor is gallium arsenide doped n type to $10^{16}$ atoms per $cm^3$ with a distance of between 1000 and 4000 angstroms between electrode faces with at least one ohmic contact involving a graded region of $Ga_{1-x}In_xAs$ and having an impressed voltage of the order of 0.3 volts.

5. The apparatus of claim 3 wherein said semiconductor has a cross-sectional area of $10^{-6}$ $cm^2$.

6. A ballistic transport signal translator comprising in combination a semiconductor body having two separated ohmic contact electrodes wherein said semiconductor body has a doping density sufficient to support conduction but less than required for high probability of carrier collision, said semiconductor body further having a distance between said electrodes greater than will permit quantum mechanical tunnelling and less than the mean-free path length of said semiconductor material, a voltage across said body sufficient for conduction but less than sufficient to produce an intervalley carrier transition and each said ohmic contact having a resistance less than $10^{-6}$ ohm $cm^2$.

7. The signal translator of claim 6 wherein said body is gallium arsenide doped n type to $10^{16}$ atoms per $cm^3$ with a distance of between 1000 and 4000 angstroms between electrode faces with at least one ohmic contact involving a graded region of $Ga_{1-x}In_xAs$ and having an impressed voltage of the order of 0.3 volts.

8. The signal translator of claim 7 wherein the cross-sectional area of said body is $10^{-6}$ $cm^2$ and the second said ohmic contact has a larger cross-sectional area than said graded region ohmic contact.

9. The apparatus of claim 1 wherein said body includes a current flow modulation control electrode means positioned between said first and second faces.

10. The apparatus of claim 2 wherein said body includes a current flow modulation control electrode of a conductivity type opposite to the conductivity type of said body positioned between said first and second surfaces.

11. The signal translator of claim 6 wherein in said body a current flow modulation control electrode means is positioned between said two ohmic contact electrodes.

12. The signal translator of claim 6 wherein said body is of n conductivity type and includes a current flow modulation control electrode of inclusions of p conductivity type positioned between and at least 1000 angstroms each from said two separated ohmic contacts.

13. In a semiconductor device of the type where majority carriers travel ballistically through a semiconductor transport region of a first conductivity type between ohmic contacts having a contact resistance less than $10^{-6}$ ohm $cm^2$, the improvement comprising a current flow modulation control electrode means of at least one region of a second conductivity type opposite to said first conductivity type positioned in said transport region between said ohmic contacts.

14. The improvement of claim 13 including means for applying a control signal through said control electrode means and means for sensing a voltage change at at least one said ohmic contact.

* * * * *